(12) United States Patent
Gandhi

(10) Patent No.: US 9,881,886 B2
(45) Date of Patent: Jan. 30, 2018

(54) SEMICONDUCTOR DEVICE ASSEMBLIES INCLUDING INTERMETALLIC COMPOUND INTERCONNECT STRUCTURES

(71) Applicant: Micron Technology, Inc., Boise, ID (US)

(72) Inventor: Jaspreet S. Gandhi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/350,926

(22) Filed: Nov. 14, 2016

(65) Prior Publication Data

US 2017/0062365 A1    Mar. 2, 2017

Related U.S. Application Data

(62) Division of application No. 14/282,606, filed on May 20, 2014, now Pat. No. 9,520,370.

(51) Int. Cl.
*H01L 23/495* (2006.01)
*H01L 23/00* (2006.01)
*H01L 25/065* (2006.01)

(52) U.S. Cl.
CPC ............. *H01L 24/05* (2013.01); *H01L 24/03* (2013.01); *H01L 24/11* (2013.01); *H01L 24/13* (2013.01); *H01L 24/16* (2013.01); *H01L 24/81* (2013.01); *H01L 25/0657* (2013.01); *H01L 2224/05023* (2013.01); *H01L 2224/0558* (2013.01);

(Continued)

(58) Field of Classification Search
CPC ........... H01L 23/5226; H01L 23/53204; H01L 23/53228; H01L 23/53233; H01L 23/5386
See application file for complete search history.

(56) References Cited

U.S. PATENT DOCUMENTS 6,867,503 B2   3/2005   Zeng
7,267,861 B2   9/2007   Edwards et al.
(Continued)

OTHER PUBLICATIONS

Lu et al., Comparison of Electromigration Performance for Pb-Free Solders and Surface Finishes with Ni UBM, Electronic Components and Technology Conference, 2008. ECTC 2008. 58th, May 27-30, 2008, pp. 360-365.

(Continued)

*Primary Examiner* — Selim Ahmed
*Assistant Examiner* — Evan Clinton
(74) *Attorney, Agent, or Firm* — TraskBritt

(57) ABSTRACT

A method of forming a semiconductor device assembly comprises forming on a first substrate, at least one bond pad comprising a first nickel material over the first substrate, a first copper material on the first nickel material, and a solder-wetting material on the first copper material. On a second substrate is formed at least one conductive pillar comprising a second nickel material, a second copper material directly contacting the second nickel material, and a solder material directly contacting the second copper material. The solder-wetting material is contacted with the solder material. The first copper material, the solder-wetting material, the second copper material, and the solder material are converted into a substantially homogeneous intermetallic compound interconnect structure. Additional methods, semiconductor device assemblies, and interconnect structures are also described.

19 Claims, 3 Drawing Sheets

(52) U.S. Cl.
CPC ............... *H01L 2224/05083* (2013.01); *H01L 2224/05147* (2013.01); *H01L 2224/05155* (2013.01); *H01L 2224/05573* (2013.01); *H01L 2224/05611* (2013.01); *H01L 2224/05639* (2013.01); *H01L 2224/05644* (2013.01); *H01L 2224/05647* (2013.01); *H01L 2224/05664* (2013.01); *H01L 2224/05666* (2013.01); *H01L 2224/05669* (2013.01); *H01L 2224/13084* (2013.01); *H01L 2224/13111* (2013.01); *H01L 2224/13139* (2013.01); *H01L 2224/13144* (2013.01); *H01L 2224/13147* (2013.01); *H01L 2224/13155* (2013.01); *H01L 2224/16145* (2013.01); *H01L 2224/16227* (2013.01); *H01L 2224/8181* (2013.01); *H01L 2224/81191* (2013.01); *H01L 2924/3656* (2013.01)

(56) References Cited

U.S. PATENT DOCUMENTS

| | | |
|---|---|---|
| 7,547,623 B2 | 6/2009 | Mis et al. |
| 8,143,722 B2 | 3/2012 | Curtis et al. |
| 8,546,919 B2 | 10/2013 | Pratt |
| 8,592,995 B2 | 11/2013 | Lin et al. |
| 2005/0224966 A1 | 10/2005 | Fogel |
| 2011/0001250 A1* | 1/2011 | Lin .................. H01L 23/49816 257/778 |
| 2011/0193226 A1 | 8/2011 | Kirby et al. |
| 2012/0070939 A1 | 3/2012 | Dunne et al. |
| 2012/0091576 A1 | 4/2012 | Tsai et al. |
| 2013/0075916 A1* | 3/2013 | Choi ....................... H01L 21/56 257/773 |
| 2013/0119528 A1* | 5/2013 | Groothuis ............... H01L 23/36 257/690 |
| 2013/0299965 A1 | 11/2013 | Gandhi |
| 2013/0299984 A1 | 11/2013 | Wang et al. |
| 2013/0299986 A1* | 11/2013 | Sun .................. H01L 23/49894 257/741 |

OTHER PUBLICATIONS

Zhang et al., Ni/Cu/Sn Bumping Scheme for Fine-Pitch Micro-Bump Connections, Electronic Components and Technology Conference (ECTC) 2011 IEEE 61st, May 31-Jun. 3, 2011, pp. 109-113.

* cited by examiner

SEMICONDUCTOR DEVICE ASSEMBLIES INCLUDING INTERMETALLIC COMPOUND INTERCONNECT STRUCTURES

CROSS-REFERENCE TO RELATED APPLICATION

This application is a divisional of U.S. patent application Ser. No. 14/282,606, filed May 20, 2014, now U.S. Pat. No. 9,520,370, issued Dec. 13, 2016, the disclosure of which is hereby incorporated herein in its entirety by this reference.

TECHNICAL FIELD

The disclosure, in various embodiments, relates generally to the field of semiconductor device design and fabrication. More specifically, the disclosure relates to methods of forming semiconductor device assemblies and interconnect structures, and to related semiconductor device assemblies and interconnect structures.

BACKGROUND

Semiconductor dice containing integrated circuits can be interconnected (e.g., attached, bonded, joined, coupled) with other semiconductor dice (in singulated form as well as in wafer or partial wafer form), interposers, circuit boards, and other higher-level packaging, to electrically and physically connect the integrated circuits thereof. For example, a semiconductor die including conductive structures (e.g., studs, columns, pillars) protruding from at least one surface thereof (e.g., a front side surface) may be inverted (e.g., flipped upside down), the conductive structures may be aligned with other conductive structures (e.g., pads, bumps) protruding from at least one surface (e.g., a back side surface) of another semiconductor die, and the conductive structures and other conductive structures may be attached to one another. Multiple semiconductor dice may be stacked upon one another in this manner to form a stacked semiconductor device assembly.

Conventionally, a solder material may be utilized to accomplish the electrical interconnection of semiconductor dice, while also providing a physical interconnection. The solder material may, for example, be in the form of a solder mass (e.g., ball, bump, layer) supported by a portion of at least one conductive structure of a semiconductor die and/or by a portion of at least one conductive structure of another semiconductor die positioned for attachment to the semiconductor die. The solder material may be reflowed to form at least one interconnect structure between the semiconductor die and the other semiconductor die that attaches the semiconductor die and the another semiconductor die to one another. The interconnect structure may comprise a bulk solder interconnect (BSI) structure or intermetallic compound (IMC) interconnect structure.

BSI structures include structures wherein a solder material has not been substantially converted into an IMC. For example, a BSI structure may comprise a structure substantially formed of and including unconverted solder material, or may comprise a structure formed of and including unconverted solder material and at least one IMC (e.g., unconverted solder material disposed between opposing regions of an IMC). Unfortunately, BSI structures can exhibit problems that may inhibit the reliability, performance, and durability of semiconductor device structures including the BSI structures. For example, during and/or after the formation of a BSI structure, the solder material may slump or even wick beyond peripheral boundaries of at least one conductive structure (e.g., pillar, bond pad) associated therewith, weakening the strength of the attachment between the interconnected semiconductor dice. In addition, the solder material of the BSI structure may undesirably facilitate the formation of voids (e.g., Kirkendall voids at an interface of the solder material and another material) after the formation of the BSI structure due to atomic migration and electron sweep.

IMC interconnect structures include structures wherein a solder material has been substantially (e.g., completely) converted into an IMC. IMC interconnect structures alleviate many of the problems associated with BSI structures (e.g., solder slumping, some post-formation interfacial void generation). Unfortunately, however, conventional methods of forming IMC interconnect structures can be impractical and/or may result in other defects that inhibit the reliability, performance, and durability of semiconductor device structures including the IMC interconnect structures. For example, conventional formation methods utilizing nickel diffusion into a tin-based solder material (e.g., to form a nickel-tin IMC interconnect structure) can be prohibitively time-consuming due to the very slow diffusion rate of nickel. As another example, conventional formation methods utilizing copper diffusion into a tin-based solder material (e.g., to form a copper-tin IMC interconnect structure), while significantly faster than formation methods utilizing nickel diffusion into a tin-based solder material due to the relatively rapid diffusion rate of copper, can result in the formation voids (e.g., Kirkendall voids at an interface of the IMC interconnect structure and remaining copper material). Such voids are due at least to the conversion of $Cu_6Sn_5$ intermetallic into $Cu_3Sn$ intermetallic and extra tin atoms and the availability of additional copper (e.g., from the remaining copper material) for rapid diffusion into the IMC interconnect structure and to react with the extra tin atoms.

It would, therefore, be desirable to have improved methods and structures that facilitate the interconnection of semiconductor dice while mitigating one or more of the problems conventionally associated with such interconnection.

DETAILED DESCRIPTION

Figure 1A:
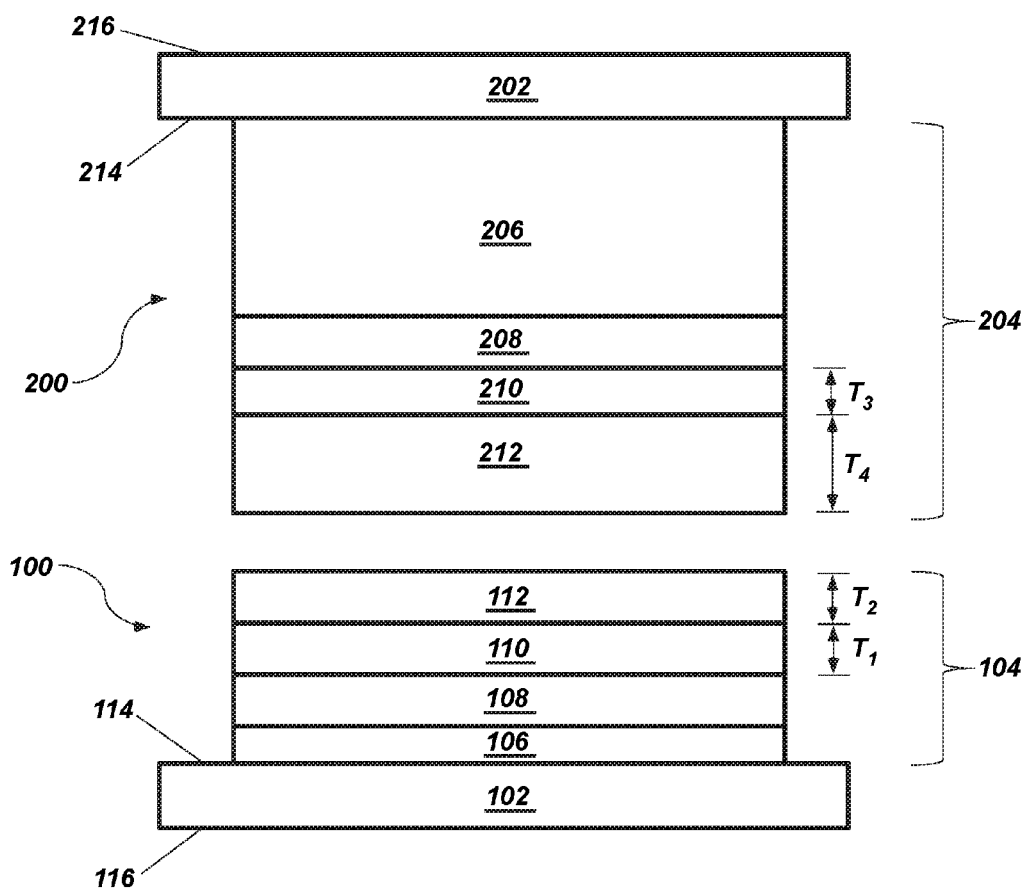
FIGS. 1A and 1B are cross-sectional views illustrating different process stages and structures for a method of forming a semiconductor device assembly, in accordance with an embodiment of the disclosure.

Methods of forming semiconductor device assemblies are disclosed, as are semiconductor device assemblies, methods of forming interconnect structures, and interconnect structures. In some embodiments, a method of forming a semiconductor device assembly comprises forming a first semiconductor die including at least one conductive structure (e.g., bond pad) overlying a first substrate, forming a second semiconductor die including at least one other conductive structure (e.g., conductive pillar) underlying a second substrate, aligning the conductive structure and the other conductive structure, and converting portions of the conductive structure and the other conductive structure into a substantially homogeneous IMC interconnect structure. The conductive structure may include a first conductive material over the first substrate, a first nickel material over the first conductive material, a first copper material over the first nickel material, and a solder-wetting material over the first copper material. The other conductive structure may include a second conductive material under the second substrate, a second nickel material under the second conductive material, a second copper material under the second nickel material, and a solder material under the second copper material. The compositions and thicknesses of the first copper material, the second copper material, the solder-wetting material, and the solder material are selected (e.g., controlled) to form the IMC interconnect structure through a copper-supply-limited diffusion and reaction process that substantially completely converts the first copper material, the second copper material, the solder-wetting material, and the solder material. In addition, the first nickel material and the second nickel material are selected and employed to substantially inhibit (e.g., prevent) the undesired diffusion of additional copper (e.g., copper beyond that provided by the combination of the first copper material, the second copper material, the solder-wetting material, and the solder material) into the solder material and/or the resulting IMC interconnect structure. Controlling the amounts of copper available to be diffused into and react with solder material facilitates the rapid formation of the IMC interconnect structure without the substantial formation of defects (e.g., voids) at interfaces between the IMC interconnect structure and other materials. The methods disclosed herein may facilitate the formation of interconnect structures, semiconductor device structures, semiconductor device assemblies, and semiconductor devices exhibiting increased reliability, performance, and durability.

The following description provides specific details, such as material compositions and processing conditions, in order to provide a thorough description of embodiments of the present disclosure. However, a person of ordinary skill in the art would understand that the embodiments of the present disclosure may be practiced without employing these specific details. Indeed, the embodiments of the present disclosure may be practiced in conjunction with conventional semiconductor fabrication techniques employed in the industry. In addition, the description provided below does not form a complete process flow for manufacturing a semiconductor device. The semiconductor device structures described below do not form a complete semiconductor device. Only those process acts and structures necessary to understand the embodiments of the present disclosure are described in detail below. Additional acts to form a complete semiconductor device from the semiconductor device structures may be performed by conventional fabrication techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, the singular forms "a," "an," and "the" are intended to include the plural forms as well, unless the context clearly indicates otherwise.

As used herein, "and/or" includes any and all combinations of one or more of the associated listed items.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below," "beneath," "under," or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

As used herein, the term "substrate" means and includes a base material or construction upon which additional materials are formed. The substrate may be a semiconductor substrate, a base semiconductor layer on a supporting structure, a metal electrode, or a semiconductor substrate having one or more layers, structures or regions formed thereon. The substrate may be a conventional silicon substrate or other bulk substrate comprising a layer of semiconductive material. As used herein, the term "bulk substrate" means and includes not only silicon wafers, but also silicon-on-insulator (SOI) substrates, such as silicon-on-sapphire (SOS) substrates and silicon-on-glass (SOG) substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped. By way of non-limiting example, a substrate may comprise at least one of silicon, silicon dioxide, silicon with native oxide, silicon nitride, a carbon-containing silicon nitride, glass, semiconductor, metal oxide, metal, a titanium nitride, a carbon-containing titanium nitride, tantalum, a tantalum nitride, a carbon-containing tantalum nitride, niobium, a niobium nitride, a carbon-containing niobium nitride, molybdenum, a molybdenum nitride, a carbon-containing molybdenum nitride, tungsten, a tungsten nitride, a carbon-containing tungsten nitride, copper, cobalt, nickel, iron, aluminum, and a noble metal.

Figure 1B:
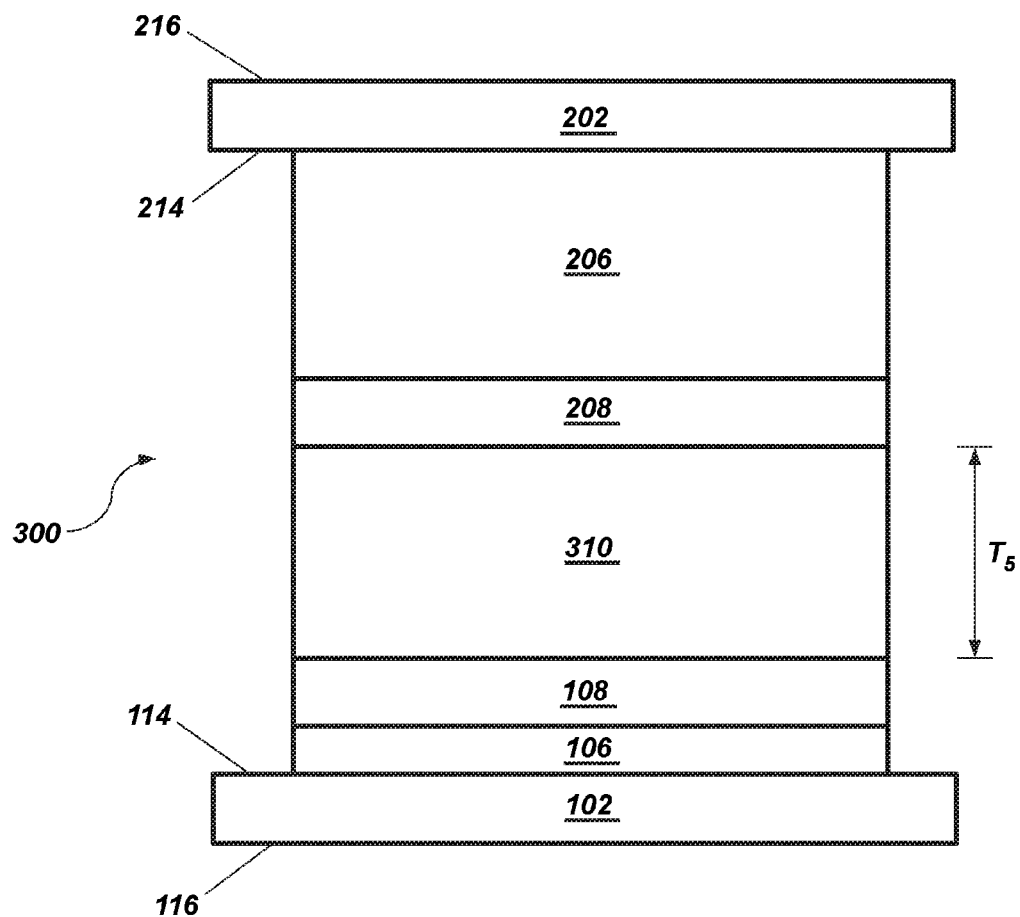

FIGS. 1A and 1B are simplified partial cross-sectional views illustrating embodiments of a method of forming a semiconductor device assembly, such as a semiconductor die assembly for a hybrid memory cube (HMC). Referring to FIG. 1A, a first semiconductor die 100 may be brought into proximity with a second semiconductor die 200. The first semiconductor die 100 may include a first substrate 102 having an upper surface 114 (e.g., a front side surface) and a lower surface 116 (e.g., a back side surface), and at least one bond pad 104 overlying the upper surface 114 of the first substrate 102. The second semiconductor die 200 may include a second substrate 202 having an upper surface 216 (e.g., a flipped back side surface) and a lower surface 214 (e.g., a flipped front side surface), and at least one conductive pillar 204 underlying the lower surface 214 of the second substrate 202. The conductive pillar 204 of the second semiconductor die 200 overlies the bond pad 104 of the first semiconductor die 100. The conductive pillar 204 of the second semiconductor die 200 may be substantially aligned with the bond pad 104 of the first semiconductor die 100 (e.g., side surfaces of the conductive pillar 204 may be substantially coplanar with side surfaces of the bond pad 104).

While various embodiments herein are described and illustrated for clarity in the context of the first semiconductor die 100 including a single bond pad 104 and the second semiconductor die 200 including a single conductive pillar 204 aligned with the single bond pad 104 of the first semiconductor die 100, the first semiconductor die 100 and the second semiconductor die 200 may, in practice and as is conventional, include a number of bond pads 104 and conductive pillars 204, respectively. For example, the first semiconductor die 100 may include multiple (e.g., a plurality of) bond pads 104 and the second semiconductor die 200 may include multiple (e.g., a plurality of) conductive pillars 204, wherein each conductive pillar 204 of the second semiconductor die 200 is substantially aligned with an associated bond pad 104 of the first semiconductor die 100 thereunder.

The bond pad 104 of the first semiconductor die 100 may include a first conductive material 106 on or over the first substrate 102, a first nickel material 108 on or over the first conductive material 106, a first copper material 110 on or over the first nickel material 108, and a solder-wetting material 112 on or over the first copper material 110. As shown in FIG. 1A, side surfaces (e.g., sidewalls) of the first conductive material 106, the first nickel material 108, the first copper material 110, and the solder-wetting material 112 may be substantially coplanar with one another. The bond pad 104 may be in direct communication with integrated circuitry in, on, over, and/or under the first substrate 102.

The first conductive material 106 may be formed of and include any electrically conductive material including, but not limited to, a metal, a metal alloy, a conductive metal-containing material (e.g., a conductive metal nitride, a conductive metal silicide, a conductive metal carbide, a conductive metal oxide), a conductively-doped semiconductor material (e.g., conductively-doped silicon, conductively-doped germanium, conductively-doped silicon germanium), or combinations thereof. The first conductive material 106 may, for example, be formed of and include at least one element of one or more of Groups VIII and IB of the Periodic Table of Elements (e.g., copper, silver, gold, cobalt, ruthenium). By way of non-limiting example, the first conductive material 106 may be formed of and include a copper material, such as elemental copper (e.g., electrolytic copper), a copper alloy (e.g., an electroless copper), another conductive copper-containing material, or a combination thereof. In some embodiments, the first conductive material 106 is substantially formed of and includes electrolytic copper. The first conductive material 106 may have any desired thickness, such as a thickness within a range of from about 1 micrometer (μm) to about 100 μm. In some embodiments, the thickness of the first conductive material 106 is about 2 μm.

The first nickel material 108 may be formed of and include any nickel-containing material compatible with the formation of an IMC interconnect structure thereon, as described in further detail below. As used herein, the term "compatible" means and includes a material that does not react with, break down, or absorb another material in an unintended way, and that also does not impair the chemical and/or mechanical properties of the another material in an unintended way. For example, the first nickel material 108 may be formed of and include elemental nickel (e.g., electrolytic nickel), a nickel alloy (e.g., a nickel-vanadium alloy), another conductive nickel-containing material, or a combination thereof. In some embodiments, the first nickel material 108 is substantially formed of and includes electrolytic nickel. The first nickel material 108 may have any desired thickness, such as a thickness within a range of from about 1 μm to about 100 μm.

The first copper material 110 may be formed of and include any copper-containing material compatible with the formation of an IMC interconnect structure partially therefrom, as described in further detail below. For example, the first copper material 110 may be formed of and include elemental copper (e.g., electrolytic copper), a copper alloy (e.g., electroless copper), another conductive copper-containing material, or a combination thereof. The first copper material 110 may be selected to have a sufficient amount of copper to facilitate the rapid and complete formation of an IMC interconnect structure formed of and including a tin-copper IMC (e.g., $Cu_6Sn_5$ intermetallic) through a copper-supply-limited diffusion and reaction process between at least the first copper material 110, a solder material 212 (described below) of the conductive pillar 204, and a second copper material 210 (described below) of the conductive pillar 204. In some embodiments, the first copper material 110 is substantially formed of and includes electrolytic copper.

The solder-wetting material 112 may be formed of and include any material permitting the solder material 212 of the conductive pillar 204 to wet the bond pad 104 during reflow of the solder material 212, and that is compatible with the formation of an IMC interconnect structure partially therefrom, as described in further detail below. By way of non-limiting example, the solder-wetting material 112 may be formed of and include at least one of silver, gold, copper, palladium, titanium, platinum, tin, alloys thereof, or combinations thereof. In some embodiments, the solder-wetting material 112 is formed of at least one of gold and palladium. The solder-wetting material 112 may act as a wetting agent for the solder material 212, may discourage oxidation of the solder material 212 during reflow, and may reduce surface tension of the solder material 212 during reflow to increase the flowability thereof. In embodiments wherein the solder-wetting material 112 is formed of and includes at least one of tin (e.g., elemental tin, a tin alloy, another tin-containing material, a combination thereof) and copper (e.g., a copper alloy, such as a tin-copper alloy), the solder-wetting material 112 may also serve as a source of tin and/or copper to facilitate the rapid and complete formation of an IMC interconnect structure formed of and including a tin-copper IMC (e.g., $Cu_6Sn_5$ intermetallic) through a copper-supply-limited diffusion and reaction process between the solder-wetting material 112, the first copper material 110, the solder material 212 of the conductive pillar 204, and the solder material 212 of the conductive pillar 204. In some embodiments, the solder-wetting material 112 is substantially formed of and includes a tin alloy (e.g., a tin-silver alloy, a tin-copper alloy). In additional embodiments, the solder-wetting material 112 is substantially formed of and includes elemental tin (e.g., substantially pure tin).

With continued reference to FIG. 1A, the conductive pillar 204 of the second semiconductor die 200 may include a second conductive material 206 under (e.g., directly under) the second substrate 202, a second nickel material 208 under (e.g., directly under) the second conductive material 206, the second copper material 210 under (e.g., directly under) the second nickel material 208, and the solder material 212 under (e.g., directly under) the second copper material 210. As shown in FIG. 1A, side surfaces (e.g., sidewalls) of the second conductive material 206, the second nickel material 208, the second copper material 210, and the solder material 212 may be substantially coplanar with one another. The conductive pillar 204 may be in direct communication with integrated circuitry in, on, over, and/or under the second substrate 202.

The second conductive material 206 may be formed of and include any electrically conductive material including, but not limited to, a metal, a metal alloy, a conductive metal-containing material (e.g., a conductive metal nitride, a conductive metal silicide, a conductive metal carbide, a conductive metal oxide), a conductively-doped semiconductor material (e.g., conductively-doped silicon, conductively-doped germanium, conductively-doped silicon germanium), or combinations thereof. The second conductive material 206 may, for example, be formed of and include at least one element of one or more of Groups VIII and IB of the Periodic Table of Elements (e.g., copper, silver, gold, cobalt, ruthenium). By way of non-limiting example, the second conductive material 206 may be formed of and include a copper material, such as elemental copper (e.g., electrolytic copper), a copper alloy (e.g., an electroless copper), another conductive copper-containing material, or a combination thereof. The second conductive material 206 may be the same as or may be different than the first conductive material 106 of the bond pad 104 of the first semiconductor die 100. In some embodiments, the second conductive material 206 is substantially formed of and includes electrolytic copper. The second conductive material 206 may have any desired thickness, such as a thickness within a range of from about 1 μm to about 100 μm. The thickness of the second conductive material 206 may be the same as or may be different than the thickness of the first conductive material 106 of the bond pad 104 of the first semiconductor die 100.

The second nickel material 208 may be formed of and include any nickel-containing material compatible with the formation of an IMC interconnect structure thereunder (e.g., directly thereunder), as described in further detail below. For example, the second nickel material 208 may be formed of and include elemental nickel (e.g., electrolytic nickel), a nickel alloy (e.g., a nickel-vanadium alloy), another conductive nickel-containing material, or a combination thereof. The second nickel material 208 may be the same as or may be different than the first nickel material 108 of the bond pad 104 of the first semiconductor die 100. In some embodiments, the second nickel material 208 is substantially formed of and includes electrolytic nickel. The second nickel material 208 may have any desired thickness, such as a thickness within a range of from about 1 μm to about 100 μm. The thickness of the second nickel material 208 may be the same as or may be different than the thickness of the first nickel material 108 of the bond pad 104 of the first semiconductor die 100.

The second copper material 210 may be formed of and include any copper-containing material compatible with the formation of an IMC interconnect structure partially therefrom, as described in further detail below. For example, the second copper material 210 may be formed of and include elemental copper (e.g., electrolytic copper), a copper alloy (e.g., electroless copper), another conductive copper-containing material, or a combination thereof. The second copper material 210 may be the same as or may be different than the first copper material 110 of the bond pad 104 of the first semiconductor die 100. Similar to the first copper material 110 of the bond pad 104, the second copper material 210 may be selected to have a sufficient amount of copper to facilitate the rapid and complete formation of an IMC interconnect structure formed of and including a tin-copper IMC (e.g., $Cu_6Sn_5$ intermetallic) through a copper-supply-limited diffusion and reaction process at least between the second copper material 210, the solder material 212, and the first copper material 110 of the bond pad 104. In some embodiments, the second copper material 210 is substantially formed of and includes electrolytic copper.

The solder material 212 may be formed of and include any tin-containing material compatible with the formation of an IMC interconnect structure partially therefrom, as described in further detail below. For example, the solder material 212 may be formed of and include elemental tin, a tin alloy (e.g., a tin-silver alloy, a tin-silver-copper alloy, a tin-silver-antimony alloy, a tin-silver-zinc alloy, a tin-zinc alloy, a tin-zinc-indium alloy, a tin-indium alloy, a tin-gold alloy, a tin-lead alloy, a tin-lead-copper alloy, a tin-bismuth-indium alloy), another tin-containing material, or a combination thereof. The solder material 212 may be selected to have a sufficient amount of tin to facilitate the rapid and complete formation of an IMC interconnect structure formed of and including a tin-copper IMC (e.g., $Cu_6Sn_5$ intermetallic) through a copper-supply-limited reaction process at least between the solder material 212, the second copper material 210, and the first copper material 110 of the bond pad 104. In some embodiments, the solder material 212 is substantially formed of and includes a tin-silver alloy having a tin content of greater than or equal to about 90 percent by weight (wt %), such as greater than or equal to about 93 wt %, or greater than or equal to about 96 wt %. For example, the solder material 212 may be substantially formed of and include tin-silver eutectic (about 96.5 wt % tin, and about 3.5 wt % silver). In additional embodiments, the solder material 212 is substantially formed of and includes elemental tin (e.g., substantially pure tin).

The thicknesses of the first copper material 110 of the bond pad 104, the solder-wetting material 112 of the bond pad 104, the second copper material 210 of the conductive pillar 204, and the solder material 212 of the conductive pillar 204 may be selected in conjunction with the material compositions thereof to facilitate the conversion of the first copper material 110, the solder-wetting material 112, the second copper material 210, and the solder material 212 into an IMC interconnect structure. For example, for given material compositions of the first copper material 110, the solder-wetting material 112, the second copper material 210, and the solder material 212, a thickness $T_1$ of the first copper material 110, a thickness $T_2$ of the solder-wetting material 112, a thickness $T_3$ of the second copper material 210, and a thickness $T_4$ of the solder material 212 may be selected relative to one another such that a limited amount of copper (e.g., supplied at least by the first copper material 110 and the second copper material 210) is introduced to (e.g., is diffused into) and reacts with tin (e.g., of at least the solder material 212) to form a IMC interconnect structure substantially formed of and including a tin-copper IMC. The thicknesses of the first copper material 110, the solder-wetting material 112, the second copper material 210, and the solder material 212 may be controlled, based on the copper and tin content thereof, to preclude either a substantial excess or a substantial deficiency of the amounts of copper and tin necessary to convert the first copper material 110, the solder-wetting material 112, the second copper material 210, and the solder material 212 into a substantially homogeneous IMC interconnect structure formed of and including $Cu_6Sn_5$ intermetallic, as described in further detail below.

As a non-limiting example, at least in embodiments wherein the first copper material 110 and the second copper material 210 each comprise electrolytic copper, the solder material 212 comprises greater than or equal to about 96 wt % tin (e.g., elemental tin, a tin-silver alloy), and the solder-wetting material 112 comprises a material substantially free of tin and copper (e.g., a material formed of and including at least one of silver, gold, titanium, platinum, palladium), the sum of the thickness $T_1$ of the first copper material 110 and the thickness $T_3$ of the second copper material 210 may be equal to about one-half (½) of the thickness $T_4$ of the solder material 212. For example, the thickness $T_1$ of the first copper material 110 may be about 2.5 μm, the thickness $T_3$ of the second copper material 210 may be about 2.5 μm, and the thickness $T_4$ of the solder material 212 may be about 10.0 μm. In additional embodiments, such as in embodiments wherein at least one of the first copper material 110 and the second copper material 210 is formed of and includes a copper-containing material other than electrolytic copper, wherein the solder material 212 comprises less than about 96 wt % tin, and/or wherein the solder-wetting material 112 comprises at least one of tin and copper, one or more of the first copper material 110, the second copper material 210, and the solder material 212 may exhibit a different thickness so long as the total amount of copper and tin encompassed by the combination of the first copper material 110, the second copper material 210, the solder material 212, and the solder-wetting material 112 is sufficient to produce a substantially homogeneous IMC structure formed of and including $Cu_6Sn_5$ intermetallic.

The first semiconductor die 100, including the first substrate 102 and the bond pad 104, and the second semiconductor die 200, including the second substrate 202 and the conductive pillar 204 may be formed using conventional processes and conventional processing equipment, which are not described in detail herein. By way of non-limiting example, the first semiconductor die 100 and the second semiconductor die 200 may each independently be formed using one or more of conventional deposition processes (e.g., physical vapor deposition, such as sputtering, evaporation, and/or ionized physical vapor deposition; plasma enhanced physical vapor deposition; chemical vapor deposition; plasma enhanced chemical vapor deposition; atomic layer deposition; plasma enhanced atomic layer deposition; electrolytic plating; electroless plating; spin-coating; dip coating; spray coating; blanket coating), conventional growth processes (e.g., in situ growth processes), conventional photolithography processes, and conventional material removal processes (e.g., etching processes, such as dry etching and/or wet etching). In addition, the first semiconductor die 100 and the second semiconductor die 200 may be positioned (e.g., to align the bond pad 104 and the conductive pillar 204) relative to one another using further conventional processes (e.g., die inversion processes, die alignment processes) and further conventional processing equipment, which are also not described in detail herein.

Referring collectively to FIGS. 1A and 1B, at least one attachment process, such at least one thermocompression process, may be used to interconnect (e.g., attach, bond, couple) the first semiconductor die 100 (FIG. 1A) to the second semiconductor die 200 (FIG. 1A) to from a semiconductor device assembly 300 (FIG. 1B). The attachment process may convert the first copper material 110 (FIG. 1A), the solder-wetting material 112 (FIG. 1A), the second copper material 210 (FIG. 1A), and the solder material 212 (FIG. 1A) into an IMC interconnect structure 310 (FIG. 1B). As shown in FIG. 1B, the IMC interconnect structure 310 may extend between and bond the first nickel material 108 of the bond pad 104 (FIG. 1A) of the first semiconductor die 100 and the second nickel material 208 of the conductive pillar 204 (FIG. 1A) of the second semiconductor die 200. The IMC interconnect structure 310 may directly physically contact each of the first nickel material 108 and the second nickel material 208.

The attachment process may include physically contacting the bond pad 104 of the first semiconductor die 100 with the conductive pillar 204 of the second semiconductor die 200, and heating the bond pad 104 and the conductive pillar 204 to at least one temperature sufficient to facilitate the diffusion of the copper of the first copper material 110 and the second copper material 210 into the solder material 212. The copper diffused in to the solder material 212 may react with the tin of the solder material 212 to form the IMC interconnect structure 310. The temperature utilized in the attachment process may be selected based on the material composition of each of the first copper material 110, the solder-wetting material 112, the second copper material 210, and the solder material 212 to facilitate the rapid diffusion of the copper into the solder material 212. The temperature employed in the attachment process may, for example, be selected to facilitate an average copper diffusion rate of greater than or equal to about 0.25 micrometer/minute (μm/min), such as greater than or equal to about 0.35 μm/min, greater than or equal to about 0.45 μm/min, greater than or equal to about 0.55 μm/min, greater than or equal to about 0.65 μm/min, greater than or equal to about 0.75 μm/min, greater than or equal to about 0.85 μm/min, greater than or equal to about 0.95 μm/min, greater than or equal to about 1.00 μm/min, or greater than or equal to about 1.10 μm/min. By way of non-limiting example, the attachment process may employ at least one temperature within a range of from about 200° C. to about 350° C. to form the IMC interconnect structure 310, such as a temperature within a range of from about 210° C. to about 325° C., from about 220° C. to about 300° C., or from about 230° C. to about 275° C. In some embodiments, each of the first copper material 110 and the second copper material 210 comprises electrolytic copper, the solder material 212 comprises at least one of tin-silver eutectic and substantially elemental tin (e.g., substantially pure tin), and the thermocompression process employs a temperature of greater than or equal to about 250° C. (e.g., greater than or equal to about 260° C., greater than or equal to about 270° C.) to consume (e.g., diffuse and react) substantially all of the copper of the first copper material 110 and the second copper material 210 and form the IMC interconnect structure 310.

As the copper of each of the first copper material 110 and the second copper material 210 diffuses into the solder material 212, $Cu_6Sn_5$ intermetallic and $Cu_3Sn$ intermetallic may each be formed based on tin-copper reaction kinetics and thermodynamics. Accordingly, the attachment process may result in the formation of an initial IMC interconnect structure formed of and including $Cu_6Sn_5$ intermetallic and $Cu_3Sn$ intermetallic. Upon the formation of the initial IMC interconnect structure, the $Cu_6Sn_5$ intermetallic thereof may at least partially convert to $Cu_3Sn$ according to the following chemical equation:

$$Cu_6Sn_5 \leftrightarrow 2Cu_3Sn + 3Sn \quad (1)$$

Conventionally, the three (3) tin atoms produced through the reaction of Equation 1 would effectuate the diffusion of nine (9) additional copper atoms from at least one copper material adjacent the initial IMC interconnect structure to facilitate the formation of additional $Cu_3Sn$ intermetallic. Such effectuated copper diffusion typically results in the formation of undesirable defects, such as Kirkendall voiding at the interface of the resulting IMC interconnect structure and the copper material. However, since the first copper material 110 and the second copper material 210 are substantially completely consumed (e.g., diffused and reacted) to form the initial IMC interconnect structure (e.g., such that the initial IMC interconnect structure is disposed directly adjacent to and between the first nickel material 108 and the second nickel material 208), such additional copper diffusion is substantially precluded. Consequently, the reaction of Equation 1 may shift back to the left, resulting in the formation of the IMC interconnect structure 310 substantially formed of and including $Cu_6Sn_5$ intermetallic. Stated another way, the IMC interconnect structure 310 may be substantially free of $Cu_3Sn$ intermetallic (and, hence, may also be substantially free of defects, such as interfacial voids, conventionally associated with the formation of $Cu_3Sn$ intermetallic).

The IMC interconnect structure 310 may exhibit a thickness $T_5$ less than or equal to the thickness $T_4$ of the solder material 212, and/or less than or equal to about two times (2×) the sum of the thickness $T_1$ of the first copper material 110 and the thickness $T_3$ of the second copper material 210. By way of non-limiting example, if the thickness $T_1$ of first copper material 110 is about 2.5 μm, the thickness $T_3$ of the second copper material 210 is about 2.5 μm, and the thickness $T_4$ of the solder material 212 is about 10 μm, the thickness $T_5$ of the IMC interconnect structure 310 may essentially be less than or equal to about 10 μm.

The IMC interconnect structure 310 may be substantially homogeneous throughout the thickness $T_5$ thereof. For example, the IMC interconnect structure 310 may exhibit a substantially uniform (e.g., even) distribution of $Cu_6Sn_5$ intermetallic throughout the thickness $T_5$ thereof. The IMC interconnect structure 310 may be substantially free of regions (e.g., portions, agglomerations, pockets) of unreacted tin, unreacted copper, and $Cu_3Sn$ intermetallic. Furthermore, any additional elements (e.g., elements of the first copper material 110, the solder-wetting material 112, the second copper material 210, and/or the solder material 212 other than copper and tin) may be substantially uniformly (e.g., evenly) distributed throughout the thickness $T_5$ of the IMC interconnect structure 310. By way of non-limiting example, the IMC interconnect structure 310 may exhibit a substantially uniform distribution of at least one of silver, gold, palladium, platinum, titanium, zinc, lead, antimony, indium, and bismuth throughout the thickness $T_5$ thereof. In some embodiments, at least one additional element may be present as an atomic substitution for copper in the $Cu_6Sn_5$ intermetallic. The homogeneity of the IMC interconnect structure 310 may be substantially undetectable by visual detection, but may be detectable by conventional spectroscopy or spectrometry techniques.

Thus, in accordance with embodiments of the disclosure, a method of forming a semiconductor device assembly comprises forming on a first substrate, at least one bond pad comprising a first nickel material over the first substrate, a first copper material on the first nickel material, and a solder-wetting material on the first copper material. On a second substrate is formed at least one conductive pillar comprising a second nickel material, a second copper material directly contacting the second nickel material, and a solder material directly contacting the second copper material. The solder-wetting material is contacted with the solder material. The first copper material, the solder-wetting material, the second copper material, and the solder material are converted into a substantially homogeneous intermetallic compound interconnect structure. Additional methods, semiconductor device assemblies, and interconnect structures are also described.

In addition, in accordance with embodiments of the disclosure, a method of forming an interconnect structure comprises contacting a conductive structure with another conductive structure to form a combined structure comprising a copper material on a nickel material, a solder-wetting material on the copper material, a tin-containing solder material on the solder-wetting material, another copper material on the tin-containing solder material, and another nickel material on the another copper material. The combined structure is heated to diffuse substantially all of the copper of the copper material and the another copper material into the solder material and form a substantially homogeneous distribution of $Cu_6Sn_5$ intermetallic on and between the nickel material and the another nickel material.

Furthermore, an interconnect structure of the disclosure comprises a substantially homogeneous distribution of an intermetallic compound comprising copper and tin on and between a nickel material and another nickel material.

Subsequent reflow(s) of the IMC interconnect structure 310 and/or the solid state aging of the semiconductor device assembly 300 may result in the diffusion of at least a portion of the nickel of the first nickel material 108 and the second nickel material 208 into the IMC interconnect structure 310. The diffusion of the nickel may be relatively slow as compared to the diffusion of the copper of the first copper material 110 and the second copper material 210, but the IMC interconnect structure 310 may ultimately exhibit a substantially uniform distribution of the nickel. The diffused nickel may be present as an atomic substitution for copper in the $Cu_6Sn_5$ intermetallic. For example, following reflow and/or solid state aging, the IMC interconnect structure 310 may exhibit a substantially uniform distribution of $(Cu,Ni)_6Sn_5$ intermetallic. The IMC interconnect structure 310 and may also be substantially free of $(Ni,Cu)_3Sn_4$ following such reflow and/or solid state aging. The diffusion of the nickel into the IMC interconnect structure 310 may decrease (e.g., reduce) the thicknesses of the first nickel material 108 and the second nickel material 208, and may increase (e.g., enlarge) the thickness $T_5$ of the IMC interconnect structure 310. The IMC interconnect structure 310 formed of and including $(Cu,Ni)_6Sn_5$ intermetallic may exhibit substantially smooth (e.g., substantially flush, substantially uniform, substantially non-corrugated, substantially non-bumpy) interfacial boundaries with remaining portions of the first nickel material 108 and the second nickel material 208.

After attaching the first semiconductor die 100 (FIG. 1A) and the second semiconductor die 200 (FIG. 1A) to form the semiconductor device assembly 300 (FIG. 1B), the semiconductor device assembly 300 may be subjected to additional processing. By way of non-limiting example, an additional semiconductor die (e.g., a semiconductor die substantially similar to the second semiconductor die 200 depicted in FIG. 1A) including at least one additional conductive pillar (e.g., another conductive pillar substantially similar to the conductive pillar 204 of the second semiconductor die 200 depicted in FIG. 1A) may be positioned proximate to and aligned with at least one additional bond pad (e.g., another bond pad substantially similar to the bond pad 104 of the first semiconductor die 100 depicted in FIG. 1A) on the upper surface 216 (e.g., flipped back side surface) of the second substrate 202. The additional bond pad may be formed on the upper surface 216 of the second substrate 202 during processing (e.g., back side processing) of second semiconductor die 200 before or after the formation of the semiconductor device assembly 300. Thereafter, at least one additional attachment process (e.g., another attachment process substantially similar to the attachment process described above in relation to FIG. 1B) may be utilized to interconnect (e.g., attach, bond, couple) the additional die to the semiconductor device assembly 300. Any number of additional die may be attached to the semiconductor device assembly 300 by way of substantially similar processing to provide the semiconductor device assembly 300 with any desired number of stacked, attached dice. In addition, a dielectric underfill material, such as a capillary underfill material, may be introduced between the stacked, attached dice of the semiconductor device assembly 300.

Figure 2:
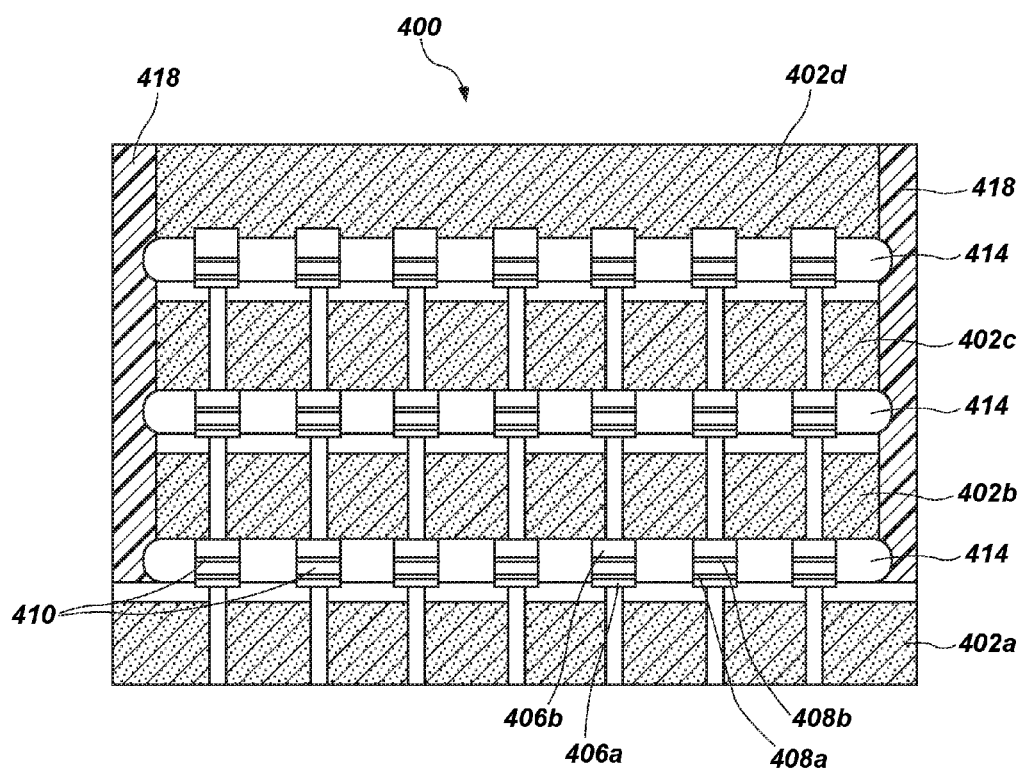
FIG. 2 is a schematic side elevation view of a semiconductor device assembly including IMC interconnect structures between stacked substrates, in accordance with an embodiment of the disclosure.

FIG. 2 depicts a schematic side elevation view of a semiconductor device assembly 400 including a plurality of IMC interconnect structures 410 bonding (e.g., interconnecting, attaching, coupling) a first substrate 402a, a second substrate 402b, a third substrate 402c, and a fourth substrate 402d. Each of the IMC interconnect structures 410 may be substantially similar to the IMC interconnect structure 310 previously described in relation to FIG. 1B. As shown in FIG. 2, each of the IMC interconnect structures 410 may be flanked by a first nickel material 408a and a second nickel material 408b, which may be flanked by a first conductive material 406a and a second conductive material 406b. The first nickel material 408a, the second nickel material 408b, the first conductive material 406a, and the second conductive material 406b may be substantially similar to the first nickel material 108, the second nickel material 208, the first conductive material 106, and the second conductive material 206 previously described in relation to FIG. 1A, respectively. An underfill material 414 may encapsulate each of the IMC interconnect structures 410, along with the first nickel material 408a, the second nickel material 408b, the first conductive material 406a, and the second conductive material 406b associated therewith. In addition, as shown in FIG. 2, the first substrate 402a at the base of the semiconductor device assembly 400 may be of greater lateral peripheral dimension than each of the second substrate 402b, the third substrate 402c, and the fourth substrate 402d. The second substrate 402b, the third substrate 402c, and the fourth substrate 402d may each be laterally surrounded by a peripheral collar 418 of encapsulant material in contact with a peripheral edge surface of the first substrate 402a. In some embodiments, the second substrate 402b, the third substrate 402c, and the fourth substrate 402d are centered on the first substrate 402a. While the semiconductor device assembly 400 is described and illustrated for clarity as including four substrates (e.g., the substrates 402a through 402d), the disclosure is not so limited, and fewer or more substrates may be employed. The architecture of semiconductor device assembly 400 is adaptable to a variety of applications. As a non-limiting example, for computing applications, the first substrate 400a may comprise a logic controller structure, while substrates 400b through 400d may comprise memory structures.

Thus, a semiconductor device assembly of the disclosure comprises a first substrate, a second substrate overlying the first substrate, and conductive structures extending between the first substrate and the second substrate, at least one of the conductive structures comprising a first nickel material over the first substrate, a substantially homogeneous intermetallic compound interconnect structure comprising copper and tin on the first nickel material, and a second nickel material on the substantially homogeneous intermetallic compound interconnect structure.

The methods of the disclosure may facilitate the rapid formation of IMC interconnect structures without the defects typically associated with conventional methods of forming IMC interconnect structures. For example, the material composition and structure of the bond pad 104 (FIG. 1A) and the conductive pillar 204 (FIG. 1A) may facilitate the formation of an IMC interconnect structure (e.g., the IMC interconnect structure 310 shown in FIG. 1B) faster than conventional methods employing a direct nickel material/tin-based solder material interface, and may also inhibit or prevent any substantial Kirkendall voiding as results from conventional methods employing a direct copper material/tin-based solder material interface without the use of a nickel material. The IMC interconnect structures and methods of the disclosure may also avoid the solder slumping and electro-migration reliability problems (e.g., atomic migration and electron sweep) typically associated with the formation and use of BSI structures. In turn, semiconductor device structures (e.g., hybrid memory cubes memory) and semiconductor devices (hybrid memory cube devices) utilizing the semiconductor die assemblies (e.g., the semiconductor device assembly 300 shown in FIG. 1B, the semiconductor device assembly 400 shown in FIG. 2) and the IMC interconnect structures (e.g., the IMC interconnect structure 310 shown in FIG. 1B, the IMC interconnect structures 410 shown in FIG. 2) of the disclosure may exhibit increased reliability, performance, and durability.

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the following appended claims and their legal equivalents.

What is claimed is:
1. A semiconductor device assembly, comprising:
a first substrate;
a second substrate overlying the first substrate; and
conductive structures extending between the first substrate and the second substrate, at least one of the conductive structures comprising:
a first nickel material over the first substrate;
a second nickel material over the first nickel material; and
a homogeneous intermetallic compound interconnect structure directly on and extending completely between the first nickel material and the second nickel material, the homogeneous intermetallic compound interconnect structure comprising copper and tin.

2. The semiconductor device assembly of claim 1, wherein the homogeneous intermetallic compound interconnect structure exhibits a uniform distribution of $(Ni,Cu)_6Sn_5$ intermetallic throughout a thickness thereof.

3. The semiconductor device assembly of claim 2, wherein the homogeneous intermetallic compound interconnect structure is substantially free of regions of elemental tin, elemental copper, $Cu_3Sn$ intermetallic, and $(Ni,Cu)_3Sn$ intermetallic.

4. The semiconductor device assembly of claim 2, wherein the homogeneous intermetallic compound interconnect structure further exhibits a uniform distribution of at least one additional element throughout a thickness thereof.

5. The semiconductor device assembly of claim 4, wherein the at least one additional element comprises at least one of silver, gold, palladium, platinum, titanium, zinc, lead, antimony, indium, and bismuth.

6. The semiconductor device assembly of claim 1, wherein interfaces between the homogeneous intermetallic compound interconnect structure and each of the first nickel material and the second nickel material are substantially free of voids.

7. The semiconductor device assembly of claim 1, wherein the at least one of the conductive structures further comprises:
a first conductive material extending between the first nickel material and the first substrate; and
a second conductive material extending between the second nickel material and the second substrate.

8. The semiconductor device assembly of claim 7, wherein the first conductive material and the second conductive material each independently comprise electrolytic copper having a thickness within a range of from about 1 μm to about 100 μm.

9. The semiconductor device assembly of claim 1, wherein the first nickel material and the second nickel material are each independently selected from the group consisting of electrolytic nickel and a nickel-vanadium alloy.

10. A semiconductor device assembly, comprising:
a first semiconductor die comprising a first substrate;
a second semiconductor die overlying the first semiconductor die and comprising a second substrate; and
a conductive structure extending between and connecting the first substrate of the first semiconductor die and the second substrate of the second semiconductor die, the conductive structure comprising:
a first copper material on the first substrate of the first semiconductor die;
a first nickel material on the first copper material;
a second nickel material over the first nickel material;
$(Ni,Cu)_6Sn_5$ intermetallic directly on and extending completely between the first nickel material and the second nickel material; and
a second copper material directly adjacent and extending between the second nickel material and the second substrate of the second semiconductor die.

11. The semiconductor device assembly of claim 10, wherein:
the first copper material and the second copper material each independently comprise elemental copper or a copper alloy; and
the first nickel material and the second nickel material each independently comprise elemental nickel or a nickel alloy.

12. The semiconductor device assembly of claim 10, further comprising:
a third semiconductor die overlying the second semiconductor die and comprising a third substrate; and
an additional conductive structure extending between and connecting the second substrate of the second semiconductor die and the third substrate of the third semiconductor die, the additional conductive structure comprising:
a third copper material on the second substrate of the second semiconductor die;
a third nickel material on the third copper material;
additional $(Ni,Cu)_6Sn_5$ intermetallic on the third nickel material;
a fourth nickel material on the additional $(Ni,Cu)_6Sn_5$ intermetallic; and
a fourth copper material directly adjacent and extending between the fourth nickel material and the third substrate of the third semiconductor die.

13. The semiconductor device assembly of claim 12, wherein the first substrate of the first semiconductor die exhibits larger lateral peripheral dimensions than each of the second substrate of the second semiconductor die and the third substrate of the third semiconductor die.

14. The semiconductor device assembly of claim 13, further comprising:
a peripheral collar in contact with a peripheral portion of the first substrate of the first semiconductor die and laterally surrounding the second substrate of the second semiconductor die and the third substrate of the third semiconductor die; and
an underfill material encapsulating the conductive structure and the additional conductive structure.

15. A semiconductor device assembly, comprising:
a first semiconductor die;
a second semiconductor die overlying the first semiconductor die; and
conductive structures extending between the first semiconductor die and the second semiconductor die, each of the conductive structures independently comprising:
a first conductive material on the first semiconductor die;
a first nickel material on the first conductive material;
a second nickel material over the first nickel material;
an intermetallic compound interconnect structure directly on and extending completely between the first nickel material and the second nickel material, the intermetallic compound interconnect structure consisting essentially of one or more of $(Ni,Cu)_6Sn_5$ intermetallic and $Cu_6Sn_5$ intermetallic; and
a second conductive material directly adjacent and extending completely between the second nickel material and the second semiconductor die.

16. The semiconductor device assembly of claim 15, wherein interfaces between the intermetallic compound interconnect structure and each of the first nickel material and the second nickel material are substantially free of Kirkendall voids.

17. The semiconductor device assembly of claim 15, wherein the first conductive material and the second conductive material each independently comprise at least one element of one or more of Groups VIII and IB of the Periodic Table of Elements.

18. The semiconductor device assembly of claim 15, wherein the intermetallic compound interconnect structure is free of $Cu_3Sn$ intermetallic.

19. The semiconductor device assembly of claim 15, wherein the intermetallic compound interconnect structure is free of $(Ni,Cu)_3Sn_4$ intermetallic.

* * * * *